United States Patent
Gilbert et al.

(10) Patent No.: US 10,090,822 B2
(45) Date of Patent: Oct. 2, 2018

(54) SURFACE ACOUSTIC WAVE (SAW) RESONATOR

(71) Applicant: Avago Technologies General IP (Singapore) Pte. Ltd., Singapore (SG)

(72) Inventors: Stephen Roy Gilbert, San Francisco, CA (US); Richard C. Ruby, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/866,273

(22) Filed: Sep. 25, 2015

(65) Prior Publication Data

US 2017/0063338 A1  Mar. 2, 2017

Related U.S. Application Data

(63) Continuation-in-part of application No. 14/835,679, filed on Aug. 25, 2015.

(51) Int. Cl.
| | | |
|---|---|---|
| *H03H 9/25* | (2006.01) | |
| *H03H 9/64* | (2006.01) | |
| *H03H 9/09* | (2006.01) | |
| *H03H 9/02* | (2006.01) | |

(52) U.S. Cl.
CPC .... *H03H 9/02574* (2013.01); *H03H 9/02866* (2013.01); *H03H 9/6483* (2013.01); *H03H 9/02614* (2013.01)

(58) Field of Classification Search
CPC .......... H03H 9/02543; H03H 9/02574; H03H 9/02614; H03H 9/02622; H03H 9/02653; H03H 9/02866; H03H 9/64; H03H 9/6496; H03H 3/08; H03H 9/6483

USPC .................................................. 333/193–196
See application file for complete search history.

(56) References Cited

U.S. PATENT DOCUMENTS

| | | | | |
|---|---|---|---|---|
| 3,887,887 A | * | 6/1975 | Wagers | H03H 3/08 29/25.35 |
| 4,163,201 A | * | 7/1979 | Takahashi | H03H 9/02559 252/62.9 R |
| 4,388,600 A | | 6/1983 | Wakino et al. | |
| 4,879,487 A | | 11/1989 | Sugai | |

(Continued)

FOREIGN PATENT DOCUMENTS

| | | | |
|---|---|---|---|
| JP | 56-114423 A | * | 9/1981 |
| JP | 05-063500 A | * | 3/1993 |

(Continued)

OTHER PUBLICATIONS

English language machine translation of JP 2001-053579 A, published Feb. 23, 2001, 7 pages.*

(Continued)

*Primary Examiner* — Barbara Summons

(57) ABSTRACT

A surface acoustic wave (SAW) resonator includes a piezoelectric layer disposed over a substrate, and a plurality of electrodes disposed over the first surface of the piezoelectric layer. A layer is disposed between the substrate and the piezoelectric layer. A surface of the layer has a smoothness sufficient to foster atomic bonding between layer and the piezoelectric layer. A plurality of features provided on a surface of the substrate reflects acoustic waves and reduce the incidence of spurious modes in the piezoelectric layer.

26 Claims, 8 Drawing Sheets

(56) References Cited

U.S. PATENT DOCUMENTS

| | | | |
|---|---|---|---|
| 5,446,330 A * | 8/1995 | Eda | H03H 3/08 310/313 R |
| 5,708,402 A * | 1/1998 | Hachisu | G06G 7/195 310/313 R |
| 6,060,818 A | 5/2000 | Ruby et al. | |
| 7,148,769 B2 * | 12/2006 | Takano | H03H 3/08 29/25.35 |
| 7,213,314 B2 * | 5/2007 | Abbott | H03H 3/08 29/25.35 |
| 7,331,092 B2 * | 2/2008 | Miura | H03H 3/08 204/192.18 |
| 7,501,912 B2 | 3/2009 | Jamneala et al. | |
| 7,504,769 B2 | 3/2009 | Sobu | |
| 7,609,129 B2 | 10/2009 | Yokota et al. | |
| 7,675,387 B2 | 3/2010 | Sakiyama | |
| 7,728,485 B2 | 6/2010 | Handtmann et al. | |
| 7,800,464 B2 * | 9/2010 | Tajima | H03H 9/02559 310/313 R |
| 7,939,987 B1 | 5/2011 | Solal et al. | |
| 8,035,464 B1 | 10/2011 | Abbott et al. | |
| 6,060,818 C1 | 12/2011 | Ruby et al. | |
| 8,866,365 B2 | 10/2014 | Hori et al. | |
| 8,946,904 B2 | 2/2015 | Railkar et al. | |
| 8,997,320 B2 | 4/2015 | Fuyutsume et al. | |
| 9,243,316 B2 | 1/2016 | Larson, III et al. | |
| 9,391,666 B1 | 7/2016 | Handtmann et al. | |
| 2003/0022412 A1 | 1/2003 | Higgins et al. | |
| 2003/0199105 A1 * | 10/2003 | Kub | H01L 21/76254 438/3 |
| 2004/0226162 A1 | 11/2004 | Miura | |
| 2005/0088257 A1 | 4/2005 | Ruby et al. | |
| 2006/0043822 A1 * | 3/2006 | Yokota | H03H 3/08 310/313 R |
| 2008/0024037 A1 | 1/2008 | Tamura | |
| 2008/0106354 A1 | 5/2008 | Kando | |
| 2014/0132117 A1 | 5/2014 | Larson, III | |
| 2014/0227434 A1 | 8/2014 | Iwamoto | |
| 2014/0320234 A1 * | 10/2014 | Takemura | H03H 9/02622 333/133 |
| 2015/0069882 A1 | 3/2015 | Umeda et al. | |
| 2015/0171823 A1 | 6/2015 | Brawley | |
| 2017/0063329 A1 | 3/2017 | Gilbert et al. | |
| 2017/0063330 A1 | 3/2017 | Gilbert et al. | |
| 2017/0063331 A1 | 3/2017 | Gilbert et al. | |
| 2017/0063332 A1 | 3/2017 | Gilbert et al. | |
| 2017/0063333 A1 | 3/2017 | Gilbert et al. | |
| 2017/0063339 A1 | 3/2017 | Burak et al. | |
| 2017/0085247 A1 | 3/2017 | Ruby et al. | |
| 2017/0222619 A1 | 8/2017 | Iwamoto | |
| 2017/0250673 A1 | 8/2017 | Ruby et al. | |

FOREIGN PATENT DOCUMENTS

| | | | |
|---|---|---|---|
| JP | 05-283971 A | * | 10/1993 |
| JP | 2000-278090 A | * | 10/2000 |
| JP | 2001-053579 A | * | 2/2001 |
| JP | 2002-330047 A | * | 11/2002 |
| JP | 2005-229455 A | | 8/2005 |
| JP | 2005-347295 | | 12/2005 |
| JP | 4723207 B2 | | 7/2011 |
| JP | 2012-015767 A | * | 1/2012 |
| JP | 2015-115870 A | * | 6/2015 |
| JP | 5814727 B2 | | 11/2015 |

OTHER PUBLICATIONS

English language machine translation of JP 05-063500 A, published Mar. 12, 1993, 3 pages.*

English language machine translation of JP 56-114423 A, published Sep. 9, 1981, 2 pages.*

Kobayashi et al., "A Study on Temperature-Compensated Hybrid Substrates for Surface Acoustic Wave Filters", 2010 IEEE International Ultrasonics Symposium Proceedings, p. 637-640.

Office Action dated Dec. 12, 2016 in co-pending U.S. Appl. No. 14/866,394, 71 pages.

Office Action dated Dec. 1, 2016 in co-pending U.S. Appl. No. 14/835,679, 107 pages.

English language machine translation of JP4723207, published Jul. 13, 2011, 14 pages.

English language machine translation of JP2005-229455, published Aug. 25, 2005, 9 pages.

English language machine translation of JP5814727, published Nov. 17, 2015, 16 pages.

Office Action dated Jun. 29, 2017 in co-pending U.S. Appl. No. 14/866,394, 15 pages.

Office Action dated Sep. 18, 2017 in co-pending U.S. Appl. No. 14/866,394, 15 pages.

Office Action dated Sep. 22, 2017 in co-pending U.S. Appl. No. 15/009,801, 13 pages.

Advisory Action dated Aug. 11, 2017 in co-pending U.S. Appl. No. 14/866,394, 4 pages.

Office Action dated Sep. 28, 2017 in co-pending U.S. Appl. No. 15/056,664, 22 pages.

Maszara, "Silicon-On-Insulator by Wafer Bonding: A Review"; The Electromechanical Society, Inc., Journal of Electrochemical Society, vol. 138, No. 1, Jan. 1991, pp. 341-347.

English language machine translation of JP2005-347295, published Dec. 15, 2005, 7 pages.

Kochar, et al., "NSPUDT using C-Axis tilted ScAlN Thin Film", Frequency Control Symposium and the European Frequency and Time Forum (FCS), 2015 Joint Conference of the IEEE International, Apr. 2015, 4 pages.

English language machine translation of JP 2015-115870A, published Jun. 22, 2015, 28 pages.

Rule 111 Response filed Jan. 18, 2018 in co-pending U.S. Appl. No. 14/866,394, 11 pages.

* cited by examiner

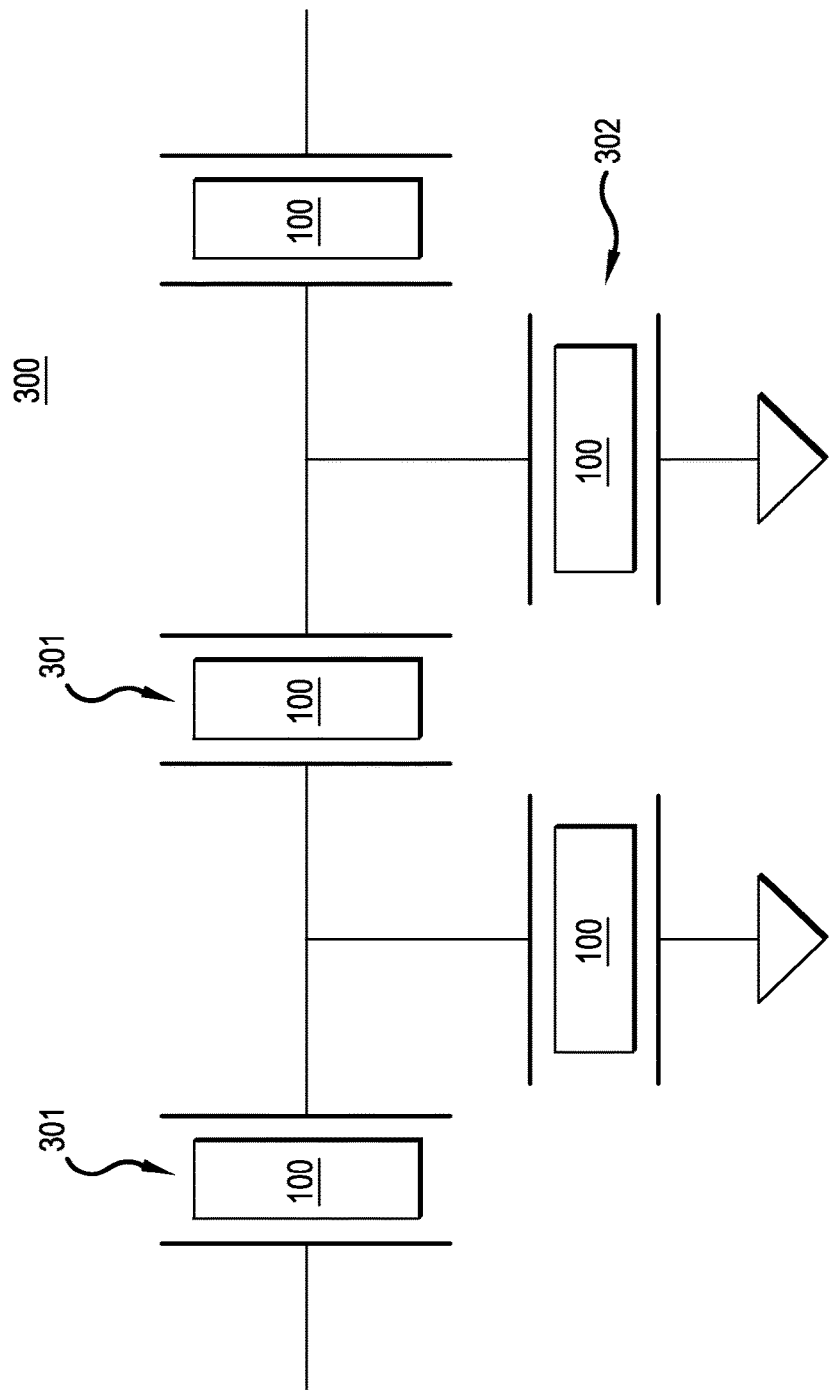

SURFACE ACOUSTIC WAVE (SAW) RESONATOR

CROSS-REFERENCE TO RELATED APPLICATIONS

The present application is a continuation-in-part under 37 C.F.R. § 1.53(b) of, and claims priority under 35 U.S.C. § 120 from, U.S. patent application Ser. No. 14/835,679 filed on Aug. 25, 2015, naming Stephen Roy Gilbert, et al. as inventors. The entire disclosure of U.S. patent application Ser. No. 14/835,679 is specifically incorporated herein by reference.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, etc.) for example, connected between an antenna (there could be several antennas like for MIMO) and a transceiver for filtering received and transmitted signals.

Various types of filters use mechanical resonators, such as surface acoustic wave (SAW) resonators. The resonators convert electrical signals to mechanical signals or vibrations, and/or mechanical signals or vibrations to electrical signals.

While certain surface modes are desired, certain standing spurious modes can exist between the opposing faces of the piezoelectric material of the SAW resonator. These spurious modes are parasitic, and can impact the performance of filters comprising SAW resonators.

What is needed, therefore, is a SAW resonator structure that overcomes at least the shortcomings of known SAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 3 is a simplified schematic block diagram of a filter comprising a SAW resonator structure according to a representative embodiment.

DETAILED DESCRIPTION

Figure 1A:
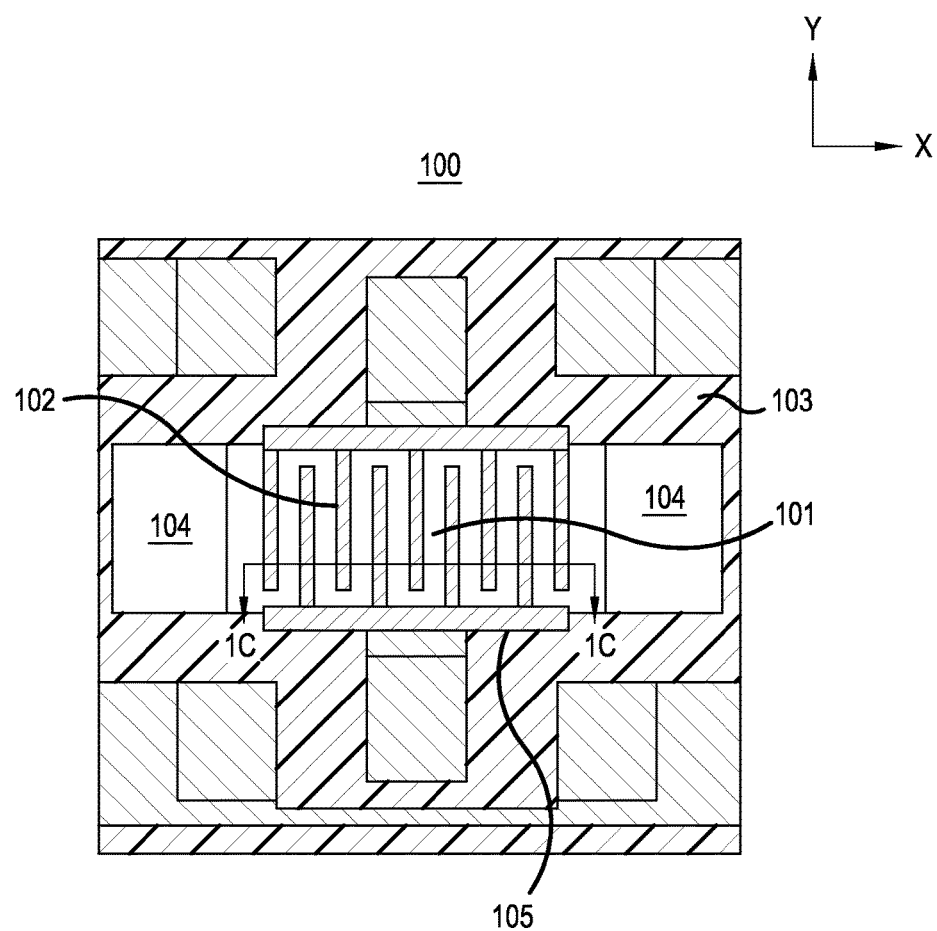
FIG. 1A is a top view of a SAW resonator structure according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, a SAW resonator structure comprises a substrate having a first surface and a second surface. The first surface of the substrate has a plurality of features. A piezoelectric layer is disposed over the substrate. The piezoelectric layer has a first surface and a second surface. A plurality of electrodes is disposed over the first surface of the piezoelectric layer, and the plurality of electrodes is configured to generate surface acoustic waves in the piezoelectric layer. The SAW resonator structure also comprises a layer disposed between the first surface of the substrate and the second surface of the piezoelectric layer, the first surface of the layer having a smoothness sufficient to foster atomic bonding between the first surface of the layer and the second surface of the piezoelectric layer, wherein the plurality of features reflect acoustic waves back into the piezoelectric layer.

FIG. 1A is a top view of a SAW resonator structure 100 according to a representative embodiment. Notably, the SAW resonator structure 100 is intended to be merely illustrative of the type of device that can benefit from the present teachings. Other types of SAW resonators, including, but not limited to dual mode SAW (DMS) resonators, and structures therefor, are contemplated by the present teachings. The SAW resonator structure 100 of the present teachings is contemplated for a variety of applications. By way of example, and as described in connection with FIG. 3, a plurality of SAW resonator structures 100 can be connected in a series/shunt arrangement to provide a ladder filter.

The SAW resonator structure 100 comprises a piezoelectric layer 103 disposed over a substrate (not shown in FIG. 1A). In accordance with representative embodiments, the piezoelectric layer 103 comprises one of lithium niobate ($LiNbO_3$), which is commonly abbreviated as LN; or lithium tantalate ($LiTaO_3$), which is commonly abbreviated as LT.

The SAW resonator structure 100 comprises an active region 101, which comprises a plurality of interdigitated electrodes 102 disposed over a piezoelectric layer 103, with acoustic reflectors 104 situated on either end of the active region 101. In the presently described representative embodiment, electrical connections are made to the SAW resonator structure 100 using the busbar structures 105.

As is known, the pitch of the resonator electrodes determines the resonance conditions, and therefore the operating frequency of the SAW resonator structure 100. Specifically, the interdigitated electrodes are arranged with a certain pitch between them, and a surface wave is excited most strongly when its wavelength $\lambda$ is the same as the pitch of the electrodes. The equation $f_0 = v/\lambda$, describes the relation between the resonance frequency ($f_0$), which is generally the operating frequency of the SAW resonator structure 100, and the propagation velocity (v) of a surface wave. These SAW waves comprise Rayleigh or Leaky waves, as is known to one of ordinary skill in the art, and form the basis of function of the SAW resonator structure 100.

Figure 1B:
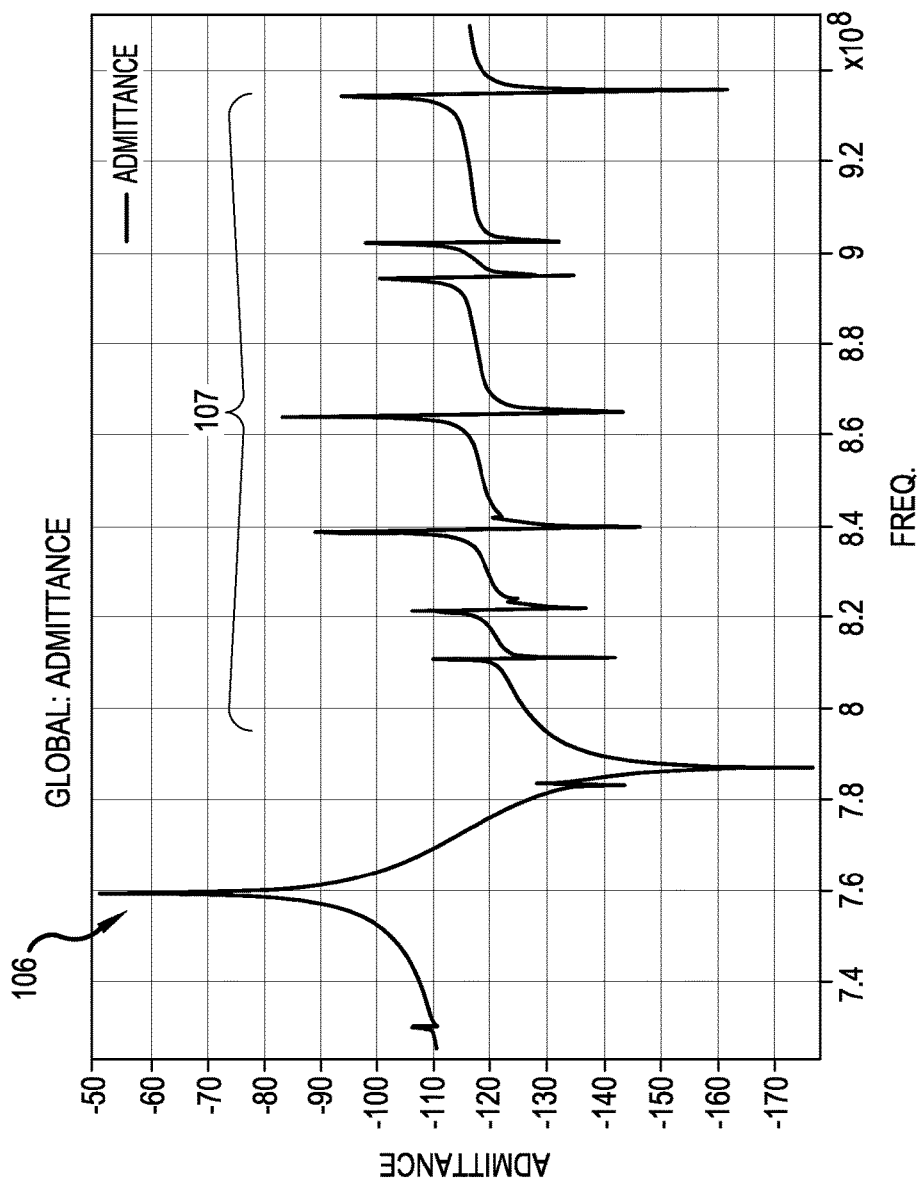
FIG. 1B is a graph of admittance versus frequency.
Figure 1C:
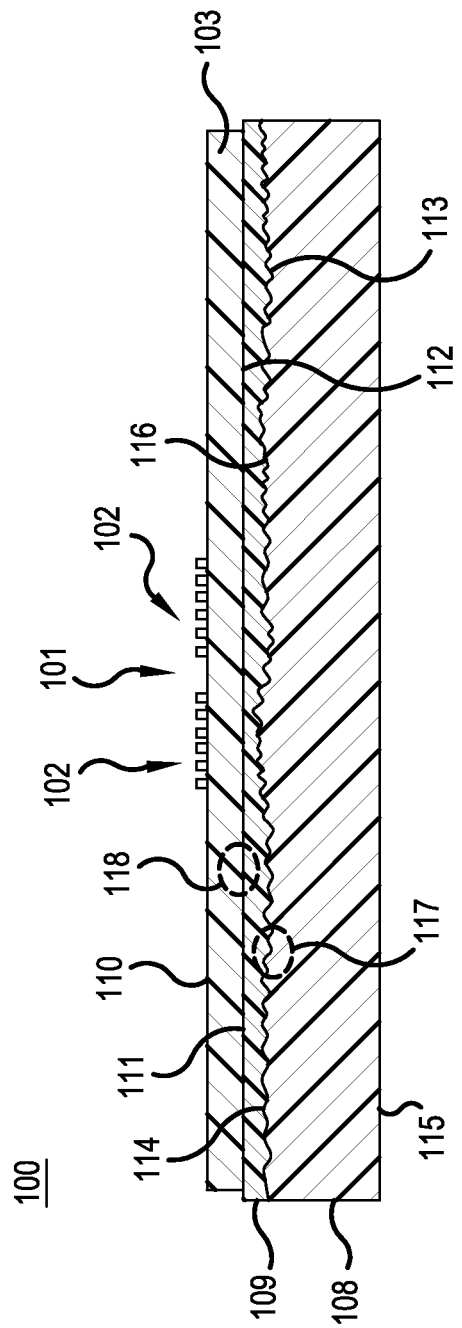
FIG. 1C is the cross-sectional view of the SAW resonator structure of FIG. 1A along line 1C-1C.

Generally, there is a desired fundamental mode, which is typically a Leaky mode, for the SAW resonator structure 100. By way of example, if the piezoelectric layer 103 is a 42° rotated LT, the shear horizontal mode will have a displacement in the plane of the interdigitated electrodes 102 (the x-y plane of the coordinate system of FIG. 1A). The displacement of this fundamental mode is substantially restricted to near the upper surface (first surface 110 as depicted in FIG. 1C) of the piezoelectric layer 103. It is emphasized that the 42° rotated LT piezoelectric layer 103, and the shear horizontal mode are merely illustrative of the piezoelectric layer 103 and desired fundamental mode, and other materials and desired fundamental modes are contemplated.

However, other undesired modes, which are often referred to as spurious modes, are established. Turning to FIG. 1B, a graph of admittance versus frequency is depicted for the illustrative 42° rotated LT piezoelectric layer 103. The desired fundamental mode, the shear horizontal mode 106, is substantially restricted to the upper surface of the piezoelectric layer 103, and has a frequency at series resonance ($F_s$). However, a number of spurious modes 107, having frequencies greater than the frequency at parallel resonance ($F_p$), can exist in the piezoelectric layer 103. As described more fully below, these spurious modes 107 are created by acoustic waves generated in the piezoelectric layer 103 that establish standing waves of various kinds of modes (with different modal shapes and frequencies). More specifically, these spurious modes 107 are created by reflections at the interface of the piezoelectric layer 103 and the substrate (see FIG. 1C) of the SAW resonator structure 100.

The spurious modes can deleteriously impact the performance of SAW resonators, and devices (e.g., filters) that include SAW resonators, if not mitigated. Most notably, if a first filter is comprised of one or more SAW resonators, and is connected to a second filter having a passband that overlaps the frequency of the spurious modes, a sharp reduction in the quality (Q) of the second filter will occur. The spurious modes are observed on a so-called Q-circle of a Smith Chart of the $S_{11}$ parameter. These sharp reductions in Q-factor are known as "rattles," and are strongest in the southeast quadrant of the Q-circle. Beneficially, significant mitigation of the adverse impact of these spurious modes is realized by the various aspects of the present teachings as described below.

FIG. 1C is a cross-sectional view of the SAW resonator structure 100 depicted in FIG. 1A along the lines 1B-1B. The SAW resonator structure 100 comprises a substrate 108 disposed beneath the piezoelectric layer 103, and a layer 109 disposed between the substrate 108 and the piezoelectric layer 103.

As noted above, the piezoelectric layer 103 illustratively comprises one of LN or LT. Generally, in the representative embodiments described below, the piezoelectric layer 103 is a wafer that is previously fabricated, and that is adhered to the layer 109 by atomic bonding as described more fully below.

The materials selected for the piezoelectric layer 103 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and is mainly used for mobile communications. LN and LT materials are often used for broadband filters, and according to the filter specifications the manufacturing materials and cutting angles differ. Filters for applications that require comparatively low loss mainly generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

In accordance with a representative embodiment, the substrate 108 comprises crystalline silicon, which may be polycrystalline or monocrystalline, having thickness of approximately 100.0 µm to approximately 800.0 µm. As will become clearer as the present description continues, the material selected for use as the substrate 108, among other considerations, is selected for ease of micromachining, using one or more of a variety of known techniques. Accordingly, other polycrystalline or monocrystalline materials besides silicon are contemplated for use as the substrate 108 of the SAW resonator structure 100. By way of example, these materials include, but are not limited to, glass, single crystal aluminum oxide ($Al_2O_3$) (sometimes referred to as "sapphire"), and polycrystalline $Al_2O_3$, to name a few. In certain representative embodiments, in order to improve the performance of a filter comprising SAW resonator structure(s) 100, the substrate 108 may comprise a comparatively high-resistivity material. Illustratively, the substrate 108 may comprise single crystal silicon that is doped to a comparatively high resistivity.

The layer 109 is illustratively an oxide material, such as $SiO_2$, phosphosilicate glass (PSG), borosilicate glass (BSG), a thermally grown oxide, or other material amenable to polishing to a high degree of smoothness, as described more fully below. The layer 109 is deposited by a known method, such as chemical vapor deposition (CVD) or plasma enhanced chemical vapor deposition (PECVD), or may be thermally grown. As described more fully below, the layer 109 is polished to a thickness in the range of approximately 0.05 µm to approximately 6.0 µm.

The piezoelectric layer 103 has a first surface 110, and a second surface 111, which opposes the first surface 110. Similarly, the layer 109 has a first surface 112 and a second surface 113. As depicted in FIG. 1B, the first surface 112 of the layer 109 is atomically bonded to the second surface 111 of the piezoelectric layer 103, as described more fully below.

The substrate 108 has a first surface 114 and a second surface 115 opposing the first surface 114. The first surface 114 has a plurality of features F109 there-across. As noted above, undesired spurious modes are launched in the piezoelectric layer 103, and propagate down to the first surface 114. As described more fully below in connection with portion 117 in FIG. 1D, the plurality of features 116 reflect undesired spurious modes at various angles and over various distances to destructively interfere with the undesired spurious waves in the piezoelectric layer 103, and possibly enable a portion of these waves to be beneficially converted into desired SAW waves. Again as described more fully below, the reflections provided by the plurality of features 116 foster a reduction in the degree of spurious modes (i.e., standing waves), which are created by the reflection of acoustic waves at the interface of the second surface 111 of the piezoelectric layer 103 and the first surface 112 of layer 109. Ultimately, the reflections provided by the plurality of features 116 serve to improve the performance of devices (e.g., filters) that comprise a plurality of SAW resonator structures 100.

As noted above, and as described more fully below in connection with the description of portion 118 in FIG. 1F, the first surface 112 of layer 109 is polished, such as by chemical-mechanical polishing in order to obtain a "mirror" like finish with a comparatively low root-mean-square (RMS) variation of height. This low RMS variation of height significantly improves the contact area between the first surface 112 of the layer 109 and the second surface 111 of the piezoelectric layer 103 to improve the atomic bonding between the first surface 112 and the second surface 111. As is known, the bond strength realized by atomic bonding is directly proportional to the contact area between two surfaces. As such, improving the flatness/smoothness of the first surface 112 fosters an increase in the contact area, thereby improving the bond of the layer 109 to the piezoelectric layer 103. As used herein, the term "atomically smooth" means sufficiently smooth to provide sufficient contact area to provide a sufficiently strong bond strength between the layer 109 and the piezoelectric layer 103, at the interface of their first and second surfaces 112, 111, respectively.

Figure 1D:
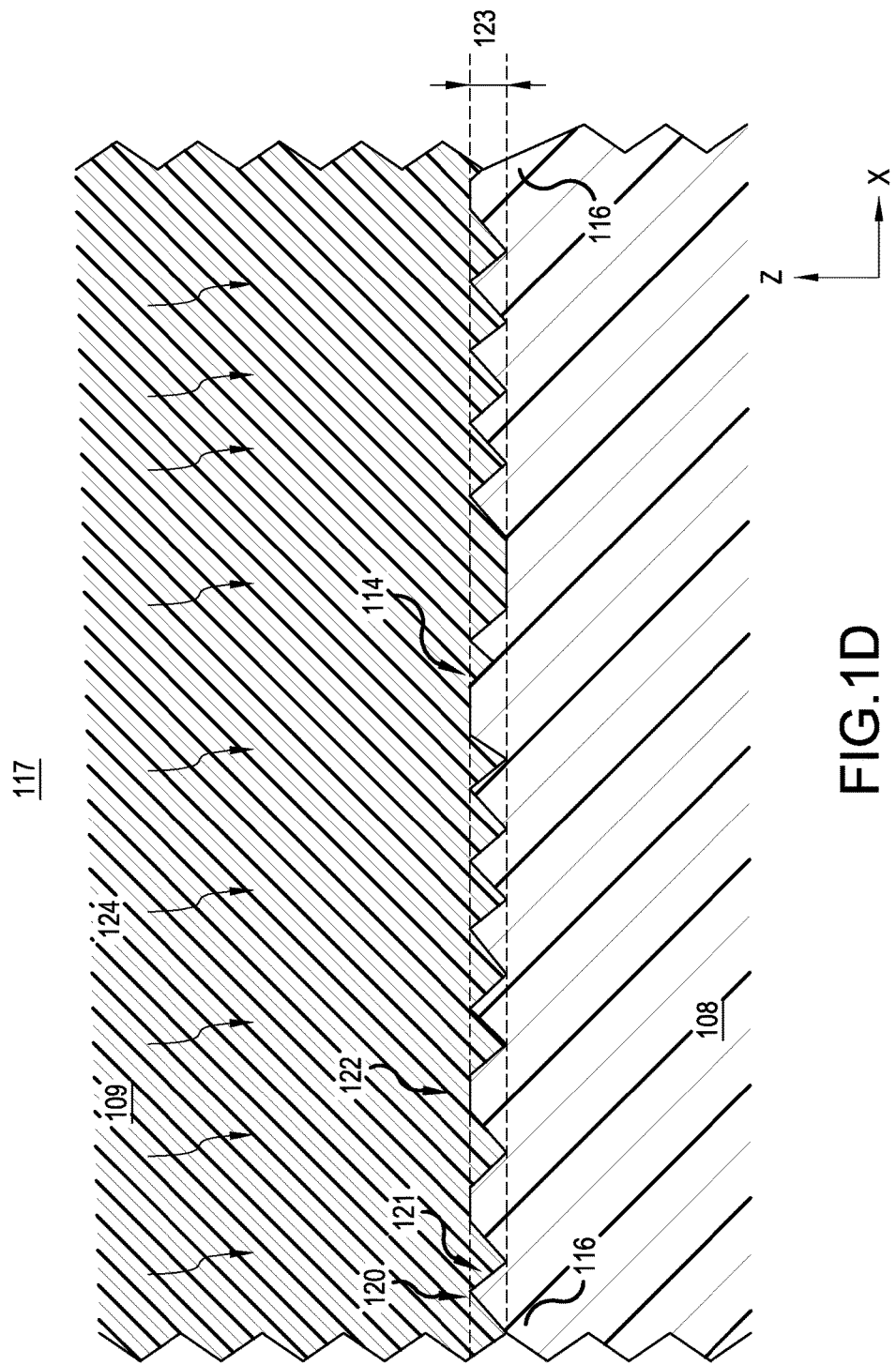
FIG. 1D is a cross-sectional view of a portion of the SAW resonator structure of FIG. 1C.

FIG. 1D is a cross-sectional view of a portion 117 of a SAW resonator structure 100 according to a representative embodiment. Portion 117 is depicted in FIG. 1C in magnified view to illustrate various aspects and functions of the plurality of features 116 of substrate 108 along the interface of the first surface 114 of the substrate 108 and the second surface 113 of the layer 109.

The shape, dimensions and spacing of the plurality of features 116 depends on their method of fabrication. For example, using a known etching technique, the plurality of features 116 are formed in the substrate 108, and may have a generally pyramidal shape 120, with sides 121. Notably, some of the plurality of features 116 may have comparatively "flat" tops 122. The plurality of features 116 also have a height 123 that may be substantially the same across the width of the interface between the substrate 108 and the layer 109. Moreover, the width (x-dimension in the coordinate system of FIG. 1C) of the plurality of features 116 may be the same, or may be different. Generally, however, the width of the features is on the order of the desired fundamental mode of the SAW resonator structure 100.

Alternatively, and again depending on the method of fabrication, the height 123 of the plurality of features 116 may not be the same. Rather, by selecting the height 123 of the plurality of features 116 to be different, a reduction in the incidence of more than one of the spurious modes can be realized.

The representative methods described presently for forming the plurality of features 116 are merely illustrative. Alternative methods, and thus alternative sizes and shapes of the plurality of features 116 are contemplated, and some are described below. Notably, regardless of the method used for their fabrication, the plurality of features 116 are beneficially not arranged in a repetitive pattern, and thus are nonperiodic. Rather, the plurality of features 116 are typically randomly located on the substrate 108, in order to avoid establishing conditions that would support standing waves (i.e., resonance conditions) in the piezoelectric layer 103, and thereby reduce the incidence of spurious modes in the piezoelectric layer 103.

The substrate 108 is illustratively single-crystal silicon, or other material having crystalline properties. The present teachings make use of the etching properties of the substrate 108 to realize the various characteristics of the plurality of features 116. In one representative embodiment, the plurality of features 116 are formed by etching the substrate 108 along crystalline planes. In this case, the plurality of features 116 having pyramidal shapes 120 and sides 121 that are on a "slant" foster reflections at off-angles relative to the incident direction of the acoustic waves 124.

Turning again to FIG. 1C, acoustic waves 124 are transmitted downwardly from the piezoelectric layer 103, having been generated by the SAW resonator structure 100, and travel through the layer 109. The acoustic waves 124 are incident on one or more of the plurality of features 116, and are reflected therefrom.

As noted above in connection with the description of FIG. 1B, there are multiple spurious modes, each having a different frequency and wavelength. In accordance with a representative embodiment, the height 123 of the plurality of features 116 off the substrate 108 is approximately one-fourth (¼) λ of one or more of the spurious modes. Selecting the height 123 of the plurality of features 116 to be approximately one-fourth (¼) λ of a particular spurious mode alters the phase of the reflected waves, and results in destructive interference by the reflected waves, and substantially prevents the establishment of standing waves, and thus spurious modes.

In some embodiments, the height 123 of the plurality of features 116 is substantially the same, and the height 123 is selected to be approximately one-fourth (¼)λ of one (e.g., a predominant) of the spurious modes. In other embodiments, the height 123 of the plurality of features 116 is not the same, but rather each different height is selected to be approximately equal to one-fourth (¼) λ of one of the multiple spurious modes (e.g., the spurious modes 107 depicted in FIG. 1B). By selecting this one height or multiple heights, the phase of the reflected waves is altered, and results in destructive interference by the reflected waves, thereby substantially preventing the establishment of standing waves of multiple frequencies, thus preventing the establishment of multiple spurious modes.

By way of example, if the spurious modes have a frequency of 700 MHz, the wavelength λ is approximately 6.0 µm. As such, the height 123 would be approximately 1.5 µm. By contrast, if the spurious modes have a frequency of 4200 MHz, the λ is approximately 1.0 µm. In this example, the height 123 would be approximately 0.25 µm. More generally, the height 123 is in the range of less than approximately 0.25 µm (e.g., 0.1 µm) to greater than approximately 1.5 µm (e.g., 2.5 µm). As will be appreciated, the range for the height 123 depends on the frequency of the fundamental mode.

The non-periodic orientation of the plurality of features 116, the generally, angled surfaces (e.g., side 121) provided by the plurality of features 116, and providing the height 123 of the plurality of features 116 to be in the noted range relative to the wavelength of the propagating spurious modes combine to alter the phase of the acoustic waves 124 incident on the various features. Beneficially, these factors in combination result in comparatively diffuse reflection of the acoustic waves 124 back through the layer 109 and into the piezoelectric layer 103. This comparatively diffuse reflection of the acoustic waves 124 from the plurality of features 116 will generally not foster constructive interference, and the establishment of resonance conditions. Accordingly, the plurality of features 116 generally prevent the above-noted parasitic acoustic standing waves (i.e., spurious modes) from being established from the acoustic waves 124 generated in the piezoelectric layer 103, which travel down and into the substrate 108.

One measure of the impact of the parasitic spurious modes on the performance of a device (e.g., filter) comprising a SAW resonator is the quality (Q) factor. For example, the parasitic spurious modes couple at the interfaces of the piezoelectric layer 103 and remove energy available for the desired SAW modes and thereby reduce the Q-factor of the resonator device. As is known, the Q-circle of a Smith Chart has a value of unity along its circumferences. The degree of energy loss (and therefore reduction in Q) is depicted with the reduction of the $S_{11}$ parameter off the unit circle. Notably, as a result of parasitic spurious modes and other acoustic losses, sharp reductions in Q of known devices can be observed on a so-called Q-circle of a Smith Chart of the $S_{11}$ parameter. These sharp reductions in Q-factor are known as "rattles" and are strongest in the southeast quadrant of the Q-circle. Beneficially, because of the diffuse reflections, and attendant phase mismatch of the reflected acoustic waves 124 realized by the plurality of features 116, compared to such known devices, a filter comprising SAW resonator structure 100 of representative embodiments of the present teachings, shows lesser magnitudes of the "rattles" and a somewhat "spreading" of the reduced "rattles" is experienced.

As noted above, the plurality of features 116 may be formed by etching the substrate 108 to reveal crystalline planes, which thereby form the pyramidal shapes 120. In one embodiment, the substrate 108 is substantially monocrystalline silicon that is selectively etched to reveal well defined crystalline planes with precise orientations. By way of example, selective masking of the substrate 108 having major surfaces lying in the (110) crystalline plane is initially carried. Illustratively, an etch resistant mask of $SiO_2$ is patterned using a buffered HF, and etching is effected by the use of an anisotropic etchant such as KOH. As is known, the depth of the etch is directly proportional to the width of the etch in this self-limiting process. This particular orientation of substrate 108 will allow for etching to reveal sides 121 in a certain (e.g., (111)) family of planes.

In one representative method, the etch mask is patterned to provide "dots" in rather random locations over the first surface 114 of the substrate 108. After etching, these "dots" are removed, and show the flat tops 122 of certain ones of the plurality of features 116. The spacing of the "dots" and the duration of the etch, to the self-limiting end, determines the depth of each etch, and therefore, the height 123 of the resultant plurality of features 116.

Again, the use of monocrystalline silicon for the substrate 108 is merely illustrative, and other materials can be processed to provide the plurality of features 116 described above.

In other representative embodiments, the plurality of features 116 have random spacing, or random orientation, or random heights, or a combination thereof. As can be appreciated, such random spacings, orientations and heights, alone or in combination can foster comparatively diffuse reflection of the acoustic waves 124 incident thereon. This diffuse reflection, in turn, alters the phase of the acoustic waves 124, and serves to reduce the propensity of standing waves (and thus spurious modes) from being established.

The random spacing, orientation, and heights of the plurality of features 116 can be effected by a number of methods. For example, the plurality of features 116 may be provided by simply using an unpolished wafer for the substrate 108. Alternatively, the second surface 115 of the substrate 108 could be rough polished by CMP, for example. While the plurality of features 116 of such an embodiment would likely not have the height relative to the wavelength of the spurious modes, the random nature of such an unpolished surface would likely provide a useful degree of diffusive reflection to avoid the establishment of a resonant condition for the spurious modes.

Figure 1E:
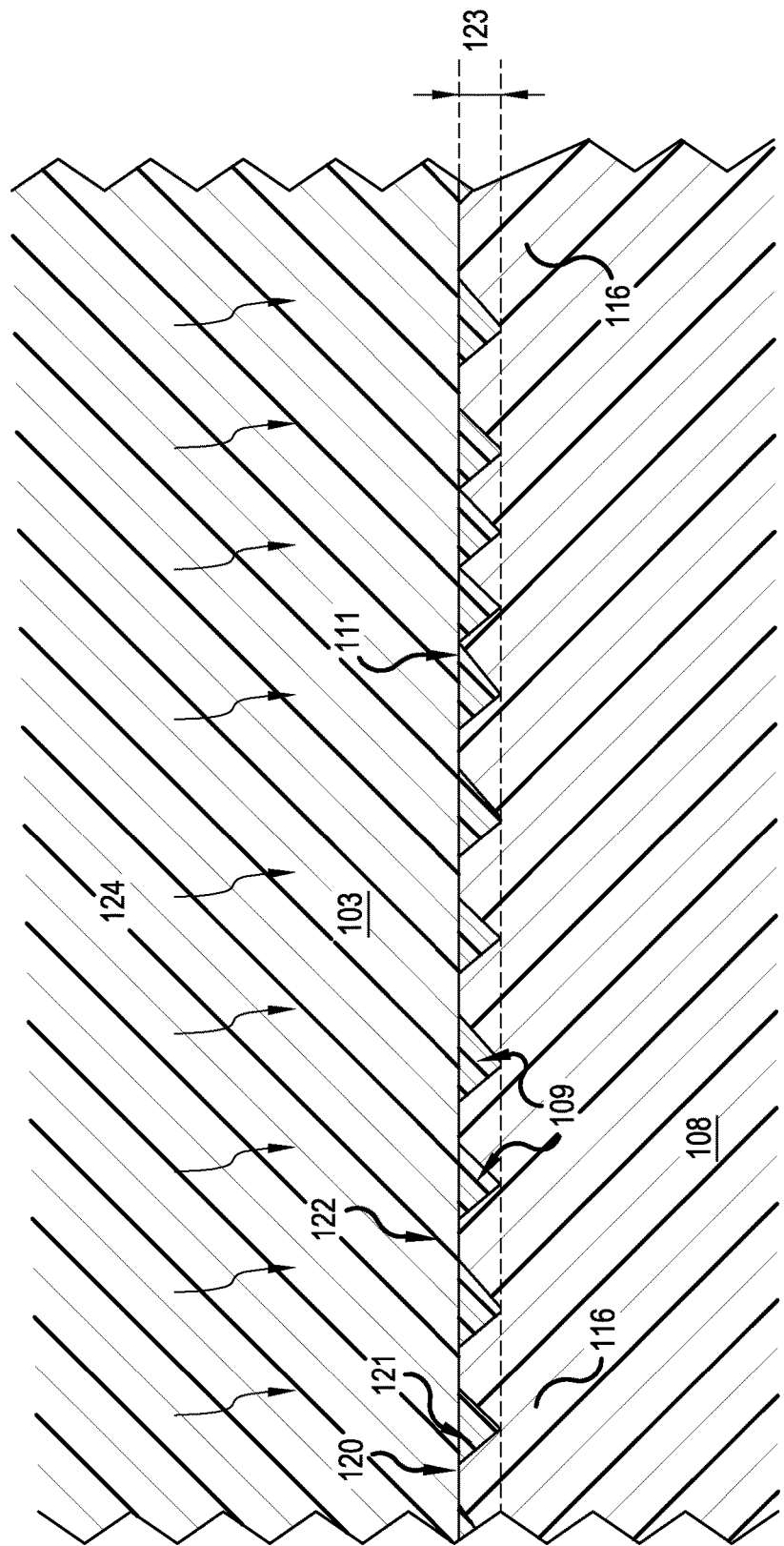
FIG. 1E is a cross-sectional view of a portion of a SAW resonator structure in accordance with a representative embodiment.

FIG. 1E is a cross-sectional view of a portion of a SAW resonator structure according to a representative embodiment. Many aspects and details of the various features and their methods of fabrication described in connection with the representative embodiments of FIG. 1E are common to those described above in connection with the representative embodiments of FIGS. 1A-1D. Such common aspects and details are often not repeated in order to avoid obscuring the description of the present representative embodiments.

Notably, the portion depicted in FIG. 1E is somewhat similar to portion 117 depicted in FIG. 1D, however differs in the depth of the polishing step used to provide first surface 112. Specifically, rather than terminating the polishing of the layer 109 at a height significantly above the plurality of features 116, the polishing step continues and in places reveals the plurality of features 116. This polishing step thus provides, in places, comparatively "flat" tops 122. By contrast, in other places, plurality of the features 116 are not altered by the polishing.

Like the plurality of features 116 depicted in FIG. 1D, the plurality of features 116 of the representative embodiments of FIG. 1E are formed by etching the substrate 108 along crystalline planes. In this case, the plurality of features 116 having pyramidal shapes 120 and sides 121 that are on a "slant" foster reflections at off-angles relative to the incident direction of the acoustic waves 124. Similarly, like the plurality of features 116 of FIG. 1D, the height 123 of the plurality of features 116 of the representative embodiments of FIG. 1E is approximately one-fourth (¼) λ of one or more of the spurious modes. Selecting the height 123 of the plurality of features 116 to be approximately one-fourth (¼) λ of a particular spurious mode alters the phase of the reflected waves, results in destructive interference by the reflected waves, and substantially prevents the establishment of standing waves, and thus spurious modes.

In some embodiments, the height 123 of the plurality of features 116 is substantially the same, and thus the height 123 is selected to be approximately one-fourth (¼)λ of one (e.g., a predominant) spurious mode. In other embodiments, the height 123 of the plurality of features 116 is not the same, but rather each different height is selected to be approximately equal to one-fourth (¼) λ of one of the multiple spurious modes (e.g., one of the spurious modes 107 depicted in FIG. 1B). By selecting such multiple heights, the phase of the reflected waves is altered, and results in destructive interference by the reflected waves, thereby substantially preventing the establishment of standing waves of multiple frequencies, thus preventing the establishment of multiple spurious modes.

In other representative embodiments, the plurality of features 116 have random spacing, or random orientation, or random heights, or a combination thereof. As can be appreciated, such random spacings, orientations and heights, alone or in combination can foster comparatively diffuse reflection of the acoustic waves 124 incident thereon. This diffuse reflection, in turn, alters the phase of the acoustic waves 124, and serves to reduce the propensity of standing waves (and thus spurious modes) from being established.

The random spacing, orientation, and heights of the plurality of features 116 can be effected by a number of methods. For example, the plurality of features 116 may be provided by simply using an unpolished wafer for the substrate 108. Alternatively, the second surface 115 of the substrate 108 could be rough polished by CMP, for example. While the plurality of features 116 of such an embodiment would likely not have the height relative to the wavelength of the spurious modes, the random nature of such an unpolished surface would likely provide a useful degree of diffusive reflection to avoid the establishment of a resonant condition for the spurious modes.

Figure 1F:
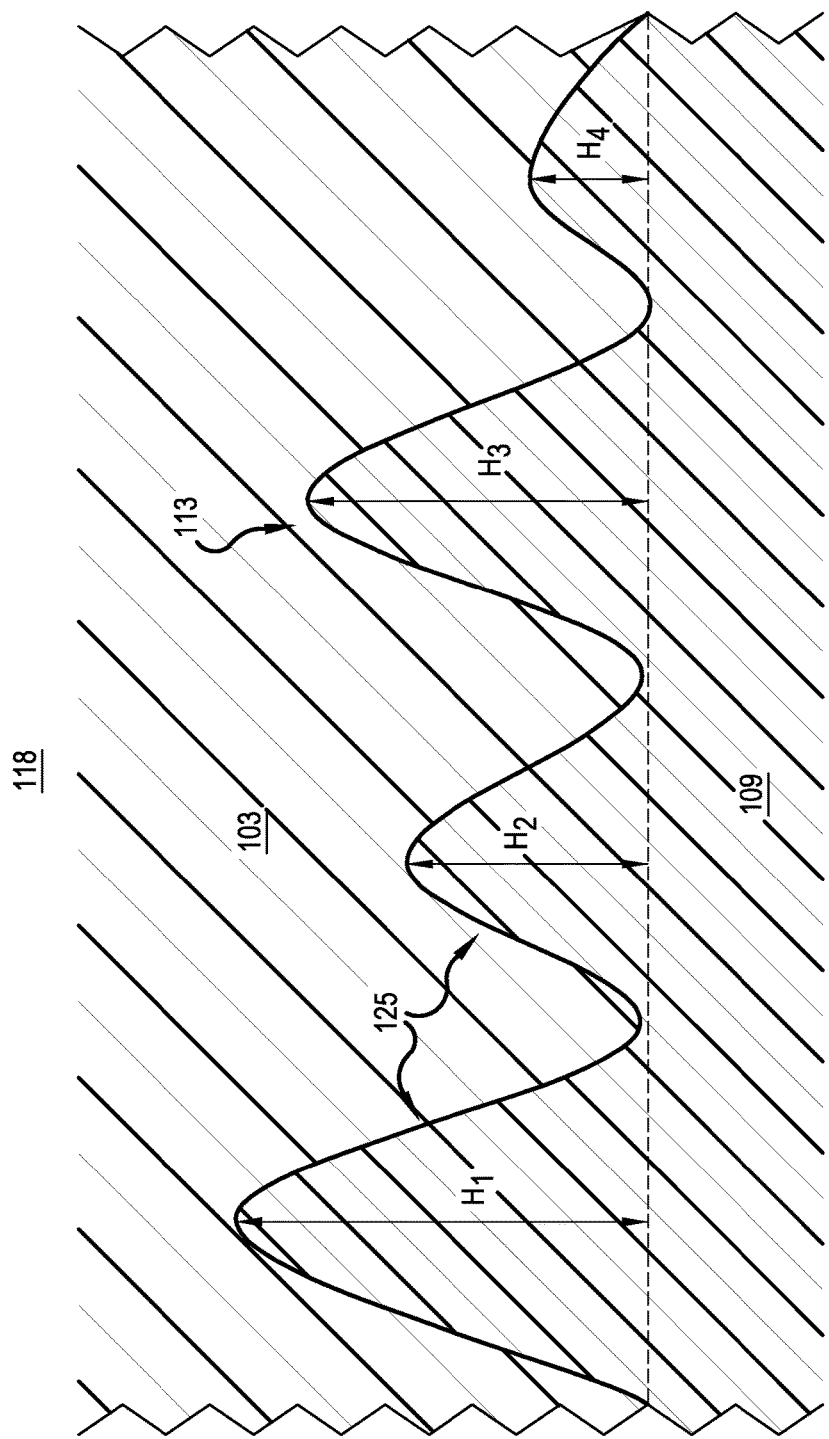
FIG. 1F is a cross-sectional view of a portion of the SAW resonator structure of FIG. 1C.

FIG. 1F is a cross-sectional view of a portion 118 of SAW resonator structure 100 according to a representative embodiment. Portion 118 is depicted in FIG. 1F in magnified view to illustrate various aspects and functions of the layer 109 along the interface of the layer 109 and the piezoelectric layer 103.

In a representative embodiment, the layer 109 is PSG, which is deposited over the substrate 108. Illustratively, the PSG is deposited at a temperature of approximately 450° C., using silane and $P_2O_5$ sources to form a soft glass like material which is approximately 8% phosphorous. This low temperature process is well known to those skilled in the art, and hence, will not be discussed in detail here.

Unfortunately, at the atomic level the surfaces of such deposited films are atomically very rough. However, the first surface 112 of layer 109 (e.g., PSG) can be polished by a known method to provide an atomically smooth surface. The surface of the layer 109 is first planarized by polishing with a slurry, using a known CMP method. The remaining PSG can then be polished using a more refined slurry. Alternatively, a single more refined slurry can be used for both polishing steps if the additional polishing time is not objectionable. As noted above, the goal is to create a "mirror" like finish that is atomically smooth in order to foster strong atomic bonding between the layer 109 and the piezoelectric layer 103, at the interface of their first and second surfaces 112, 111 respectively. Further details of the polishing sequence can be found, for example, in U.S. Pat. No. 6,060,818 and U.S. Patent Application Publication 20050088257, to Ruby, et al. The entire disclosures of U.S. Pat. No. 6,060,818, and U.S. Patent Application Publication 20050088257 are specifically incorporated herein by reference.

FIG. 1F depicts four "humps" 125 in the layer 109 after the completion of the cleaning of the wafer to remove remnants of the CMP process, as described, for example, in above-incorporated U.S. Pat. No. 6,060,818 and U.S. Patent Application Publication 20050088257, to Ruby, et al. The "humps" 125 depict variation in the first surface 112. The first hump has a first height, $H_1$, the second hump has a second height, $H_2$, the third hump has a third height, $H_3$, and the fourth hump has a fourth height, $H_4$. For the purposes of illustration, only four humps 125 are shown. The root mean squared (RMS) variation in the height of the first surface 112 of the layer 109 comprised of the four humps 125 depicted is less than approximately 0.5 μm. As noted above, the term "atomically smooth" herein means sufficiently smooth to provide sufficient contact area to provide a sufficiently strong bond strength between the layer 109 and the piezoelectric layer 103, at the interface of their first and second surfaces 112, 111, respectively. Such an atomically smooth surface can be realized by providing the first surface 112 of layer 109 having an RMS variation in height of in the range of approximately 0.1 Å to approximately 10.0 Å; although beneficially, the RMS variation in height is less than approximately 5.0 Å.

As noted above, the forming of an atomically smooth first surface 112 provides an increased contact area at the interface of the first and second surfaces 112, 111, respectively, of the layer 109 and the piezoelectric layer 103. This increased contact area, in turn, fosters a comparatively strong atomic bond between the layer 109 and the piezoelectric layer 103. Among other benefits, the strong atomic bond between the layer 109 and the piezoelectric layer 103 reduces separation or delamination of the layer 109 and the piezoelectric layer 103, thereby increasing the reliability of devices comprising the SAW resonator structure 100 over time.

Figure 2:
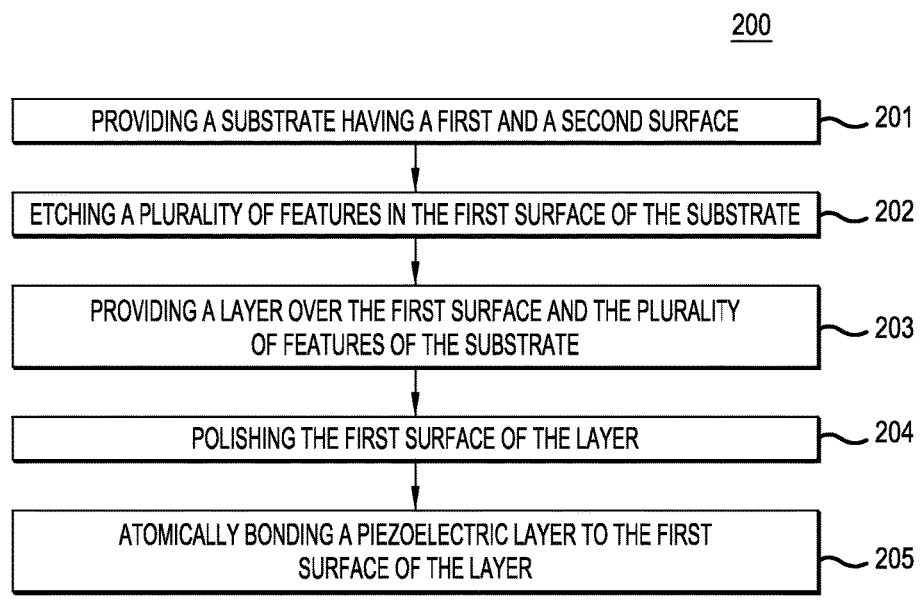
FIG. 2 is a flow-chart of a method of fabricating a SAW resonator structure according to a representative embodiment.

FIG. 2 is a flow-chart of a method 200 of fabricating a SAW resonator structure according to a representative embodiment. Many aspects and details of the method, including illustrative materials, processes, and dimensions are common to those described above. These aspects and details may not be repeated to avoid obscuring the presently described representative embodiment.

At 201, the method begins with providing a substrate having a first surface and a second surface. As noted above, among other materials, the substrate (e.g., substrate 108) may be monocrystalline silicon.

At 202 a plurality of features (e.g., plurality of features 116) are etched into the substrate.

At 203 a layer is provided over a first surface of the substrate, which comprises the plurality of features. As noted above, the layer (e.g., layer 109) may be an oxide (glass), such as $SiO_2$ or PSG.

At 204, a first surface of the layer is polished to provide a comparatively smooth first surface. As noted above, a CMP method may be used to provide a first surface that is atomically smooth to foster a strong atomic bond between the layer (e.g. layer 109) and the piezoelectric layer (e.g. piezoelectric layer 103).

At 205, the method comprises atomically bonding a piezoelectric layer to the first surface of the layer. Notably, this comprises contacting the piezoelectric layer (e.g., piezoelectric layer 103) with the layer that has been polished to an atomically smooth degree.

As noted above, when connected in a selected topology, a plurality of SAW resonators can function as an electrical filter. FIG. 3 shows a simplified schematic block diagram of an electrical filter 300 in accordance with a representative embodiment. The electrical filter 300 comprises series SAW resonators 301 and shunt SAW resonators 302. The series SAW resonators 301 and shunt SAW resonators 302 may each comprise SAW resonator structures 100 described in connection with the representative embodiments of FIGS. 1A~2. As can be appreciated, the SAW resonator structures (e.g., a plurality of SAW resonator structures 100) that comprise the electrical filter 300 may be provided over a common substrate (e.g., substrate 108), or may be a number of individual SAW resonator structures (e.g., SAW resonator structures 100) disposed over more than one substrate (e.g., more than one substrate 108). The electrical filter 300 is commonly referred to as a ladder filter, and may be used for example in duplexer applications. It is emphasized that the topology of the electrical filter 300 is merely illustrative and other topologies are contemplated. Moreover, the acoustic resonators of the representative embodiments are contemplated in a variety of applications including, but not limited to duplexers.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A surface acoustic wave (SAW) resonator structure, comprising:
   a substrate having a first surface and a second surface, the first surface having a plurality of features;
   a piezoelectric layer disposed over the substrate, the piezoelectric layer having a first surface and a second surface;
   a plurality of electrodes disposed over the first surface of the piezoelectric layer, the plurality of electrodes configured to generate surface acoustic waves in the piezoelectric layer; and
   a layer disposed between the first surface of the substrate and the second surface of the piezoelectric layer, a first surface of the layer being atomically smooth to foster atomic bonding between the first surface of the layer and the second surface of the piezoelectric layer, wherein the plurality of features reflect acoustic waves and reduce an incidence of a plurality of spurious modes in the piezoelectric layer, and the acoustic waves reflected from the plurality of features destructively interfere with acoustic waves in the piezoelectric layer.

2. A SAW resonator structure as claimed in claim 1, wherein the features in the first surface of the substrate are substantially pyramidal in shape.

3. A SAW resonator structure as claimed in claim 1, wherein the plurality of features each have a height of approximately one-fourth of a wavelength (¼ λ) of a spurious mode.

4. A SAW resonator structure as claimed in claim 1, wherein the plurality of features each have a height in a range of approximately 0.25 µm to approximately 1.5 µm.

5. A SAW resonator structure as claimed in claim 1, wherein the plurality of features each have a height in a range of approximately 0.1 µm to approximately 2.50 µm.

6. A SAW resonator structure as claimed in claim 1, wherein the plurality of features have a plurality of heights, and each of the pluralities of heights is a height of approximately one-fourth of a wavelength (¼ λ) of one of the plurality of spurious modes.

7. A SAW resonator structure as claimed in claim 1, wherein the layer comprises an oxide material.

8. A SAW resonator structure as claimed in claim 7, wherein the oxide material comprises silicon dioxide ($SiO_2$).

9. A surface acoustic wave (SAW) filter comprising a plurality of SAW resonator structures, one or more of the plurality of SAW resonator structures comprising:
   a substrate having a first surface and a second surface, the first surface having a plurality of features;
   a piezoelectric layer disposed over the substrate, the piezoelectric layer having a first surface and a second surface;
   a plurality of electrodes disposed over the first surface of the piezoelectric layer, the plurality of electrodes configured to generate surface acoustic waves in the piezoelectric layer; and
   a layer disposed between the first surface of the substrate and the second surface of the piezoelectric layer, a first surface of the layer being atomically smooth to foster atomic bonding between the first surface of the layer and the second surface of the piezoelectric layer, wherein the plurality of features reflect acoustic waves and reduce an incidence of a plurality of spurious modes in the piezoelectric layer, and the acoustic waves reflected from the plurality of features destructively interfere with acoustic waves in the piezoelectric layer.

10. A SAW filter as claimed in claim 9, wherein the plurality of features in the first surface of the substrate are substantially pyramidal in shape.

11. A SAW filter as claimed in claim 9, wherein each of the plurality of features have a height of approximately one-fourth of a wavelength (¼ λ) of a spurious mode.

12. A SAW filter as claimed in claim 11, wherein each of the plurality of features have a height in a range of approximately 0.25 µm to approximately 1.5 µm.

13. A SAW filter as claimed in claim 11, wherein each of the plurality of features have a height in a range of approximately 0.1 µm to approximately 2.50 µm.

14. A SAW filter as claimed in claim 11, wherein the plurality of features have a plurality of heights, and each of the plurality of heights is height of approximately one-fourth of a wavelength (¼ λ) of one of the plurality of spurious modes.

15. A SAW filter as claimed in claim 9, wherein the SAW filter is a ladder filter, comprising the plurality of SAW resonator structures.

16. A SAW filter as claimed in claim 9, wherein the layer comprises an oxide material.

17. A SAW filter as claimed in claim 16, wherein the oxide material comprises silicon dioxide ($SiO_2$).

18. A SAW filter as claimed in claim 16, wherein the first surface of the layer has a root-mean-square (RMS) variation in height of approximately 1.0 Å to approximately 10.0 Å or less.

19. A SAW filter as claimed in claim 9, wherein two or more of the plurality of SAW resonator structures are configured in a series and shunt configuration.

20. A surface acoustic wave (SAW) resonator structure, comprising:
a substrate having a first surface and a second surface, the first surface having a plurality of features;
a piezoelectric layer disposed over the substrate, the piezoelectric layer having a first surface and a second surface;
a plurality of electrodes disposed over the first surface of the piezoelectric layer, the plurality of electrodes configured to generate surface acoustic waves in the piezoelectric layer; and
a layer comprising silicon dioxide, and disposed between the first surface of the substrate and the second surface of the piezoelectric layer, the plurality of features have a plurality of heights, and each of the plurality of heights is approximately one-fourth of a wavelength (¼ λ) of one of a plurality of spurious modes, wherein the plurality of features reflect acoustic waves and reduce an incidence of the plurality of spurious modes in the piezoelectric layer.

21. A SAW resonator structure as claimed in claim 20, wherein, the acoustic waves reflected from the plurality of features destructively interfere with acoustic waves in the piezoelectric layer.

22. A SAW resonator structure as claimed in claim 20, wherein the plurality of features in the first surface of the substrate are substantially pyramidal in shape.

23. A SAW resonator structure as claimed in claim 20, wherein the plurality of features are substantially not in a regular pattern.

24. A SAW resonator structure as claimed in claim 20, wherein each of the plurality of heights is in a range of approximately 0.25 μm to approximately 1.5 μm.

25. A SAW resonator structure as claimed in claim 20, wherein each of the plurality of heights is in a range of approximately 0.1 μm to approximately 2.50 μm.

26. A SAW resonator structure as claimed in claim 20, wherein a first surface of the layer has a root-mean-square (RMS) variation in height of approximately 0.1 Å to approximately 10.0 Å.

* * * * *